United States Patent [19]

Wacyk

[11] Patent Number: 4,567,387
[45] Date of Patent: Jan. 28, 1986

[54] LINEAR SENSE AMPLIFIER

[75] Inventor: Ihor T. Wacyk, Bridgewater, N.J.

[73] Assignee: RCA Corporation, Princeton, N.J.

[21] Appl. No.: 509,787

[22] Filed: Jun. 30, 1983

[51] Int. Cl.⁴ ............... H03K 5/153; G11C 7/06; G11C 11/40; H03F 3/16

[52] U.S. Cl. .................... 307/530; 307/354; 307/491; 307/493; 330/288; 365/203; 365/205; 365/208

[58] Field of Search ............ 307/530, 362, 363, 354, 307/279, 491, 493, 500, 501; 365/156, 188, 189, 196, 203, 205, 207, 208; 330/288

[56] References Cited

U.S. PATENT DOCUMENTS

| 4,208,730 | 6/1980 | Dingwall et al. | 365/203 |
|---|---|---|---|
| 4,239,994 | 12/1980 | Stewart | 365/208 X |
| 4,281,400 | 7/1981 | Schanzer et al. | 365/203 |
| 4,405,996 | 9/1983 | Stewart | 365/203 |
| 4,434,381 | 2/1984 | Stewart | 365/208 X |
| 4,447,892 | 5/1984 | Zibu | 365/203 X |
| 4,460,985 | 7/1984 | Hoffman | 307/530 X |

Primary Examiner—Larry N. Anagnos
Attorney, Agent, or Firm—Joseph S. Tripoli; George E. Haas; Henry I. Schanzer

[57] ABSTRACT

A sense amplifier suitable for use with a source of binary signals, where one of the signals is "well" defined and the other is "poorly" defined includes a current source for producing a bias current which is of the same polarity as the current produced by the ill defined signal and of amplitude intermediate the amplitude of the currents produced by the ill and well defined signals. The bias current and signal source currents are summed and when applied to an inverter which is precharged to, or close to, its transition point cause the inverter output to respond with approximately equal speed to either of the two binary conditions.

12 Claims, 2 Drawing Figures

LINEAR SENSE AMPLIFIER

Government has rights in this invention pursuant to contract no. DAAK20-81-C-0411 awarded by the Department of the Army.

This invention relates to sensing means, and in particular, to means for quickly and reliably sensing binary information.

Figure 1:
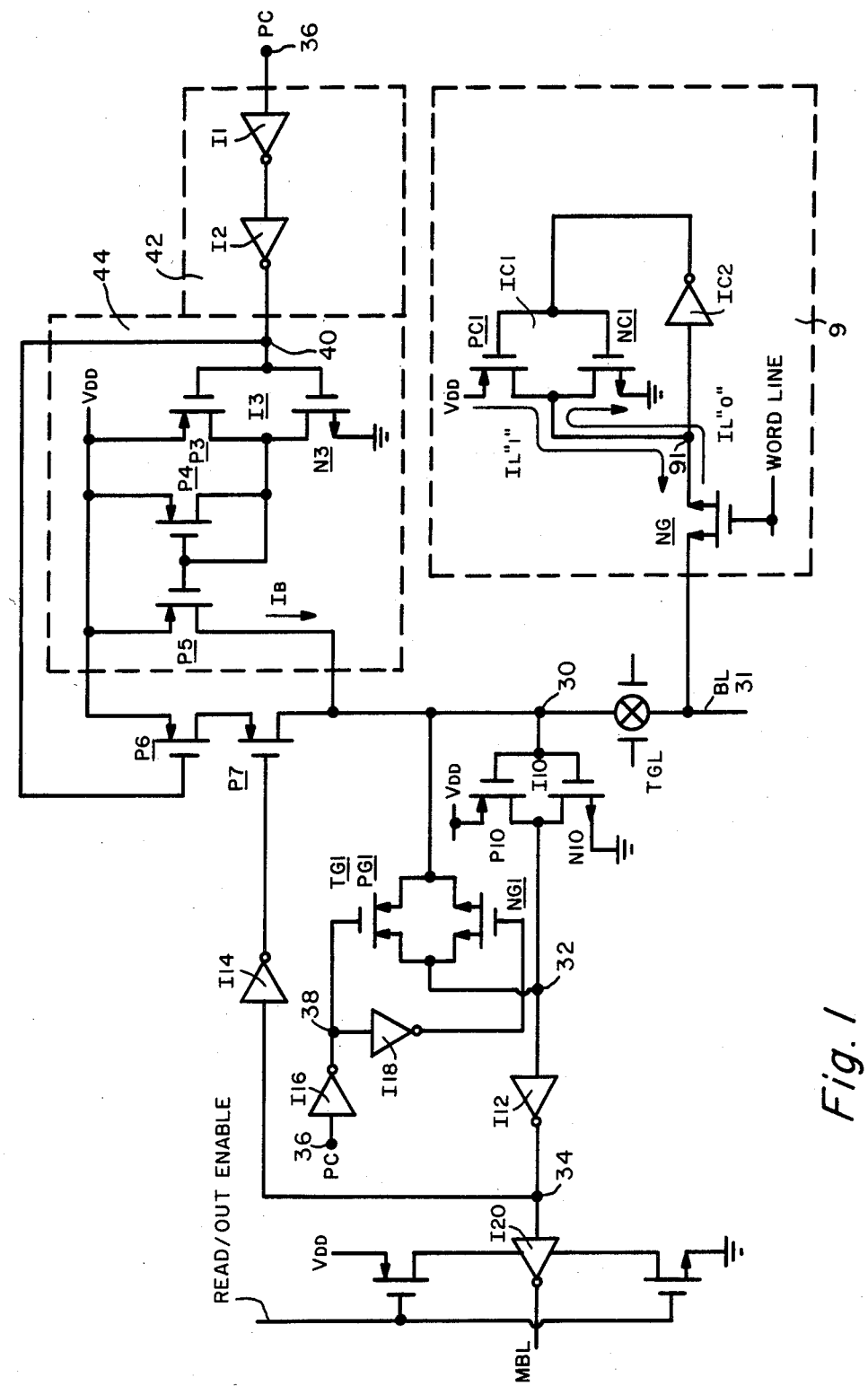

Sensing binary information may be problematic because of constraints placed on the signal source. For example, in the design of large memory arrays, it is critical that the number of devices per memory cell must be small and the number of lines to access the cells must be as few as possible to achieve a high packing density. By way of example, memory cell 9 in FIG. 1 is a known static memory cell comprised of 5 transistors which satisfies these general requirements. Four (i.e. PC1, NC1, and PC2 and NC2 which form inverter IC2) of the five transistors are interconnected to form a flip-flop and the fifth transistor, (i.e. NG), referred to herein as the "gating" transistor, functions as a transmission gate. Transistor NG is connected between a single input-output (I/O) point to the flip-flop and a bit line (BL) and is used both to sense the state of the cell at selected times and to write information into the cell at other selected times.

Where a single gating transistor is used, there exists one binary condition of the flip-flop for which the gating transistor operates in the (source or emitter) follower mode. In this mode, there is a voltage offset ($V_T$ or $V_{BE}$) between the control electrode (gate or base) of the transistor and one end of its conduction path (source or emitter), and this same offset appears across the conduction path of the transistor. For example, assume that the gating transistor is an insulated-gate field-effect transistor (IGFET) of N conductivity type. When a "high" signal is present at the I/O of the flip-flop and a like "high" signal of, for example, $V_{DD}$ volts is applied to the gate electrode of the gating transistor, the value of the signal coupled from the drain (I/O point) to the source (bit line) of the gating transistor is offset by at least the value of the threshold voltage, $V_T$, of the transistor. That is, the maximum value of potential coupled to the bit line is $V_{DD} - V_T$. When $V_{DD}$ is at the lower portion of its 2.5 volt to 15 volt range and $V_T$ is one or two volts, the offset voltage across the gating transistor may prevent the "high" stored in the cell from being applied to the bit line. Thus for this one binary condition, an "ill" defined current or voltage is produced in that the gating transistor cannot provide a sufficiently low impedance path for current flow from the cell to the bit line. For the other binary condition, the gating transistor conducts in the common source mode and passes a "well" defined current or voltage which can easily clamp the bit line to the other binary condition.

Sensing binary information is thus problematic where the source of binary signal has one "poorly" or "ill" defined condition (e.g. the "1" condition of the memory cell for which it cannot source—supply—much, if any, current) although its other condition is well defined (e.g. the "0" condition for which it can sink—draw to ground—substantial current).

A sense amplifier designed to overcome this problem is discussed in U.S. Pat. No. 4,239,994, whose teachings are incorporated herein by reference. The patented sense amplifier includes bias means connected to the input of the sense amplifier to offset its input, during precharge, by a small amount (e.g. a few millivolts) to preset the sense amplifier to a state corresponding to the "ill" defined condition. The offset is made small such that when a "well" defined binary condition is coupled to the sense amplifier its output is quickly driven to the condition corresponding to the well defined condition. However, one problem with the offset is that the sense amplifier response is highly asymmetric in that it responds faster to the ill defined condition than to the well defined condition. Another problem is that the offset causes a small but abrupt shift in the voltage level at the output of the sense amplifier when the precharge ends. This shift reduces the benefits gained from offsetting the sense amplifier to anticipate the ill defined condition. Thus, in a typical application, the shift adds to the access time and causes the sense amplifier response to be imbalanced.

Circuits embodying the invention include a current source for producing a bias current which is of the same polarity as the current produced by the ill defined signal and of amplitude intermediate the amplitude of the currents produced by the ill and well defined signals. The bias current and signal source currents are summed and when applied to a sense amplifier which is precharged to, or close to, its transition point cause the sense amplifier to respond with approximately equal speed to either of the two binary conditions. Consequently, the output of the sense amplifier tends to be balanced and little, if any, shift is present at the termination of precharge.

Figure 2:
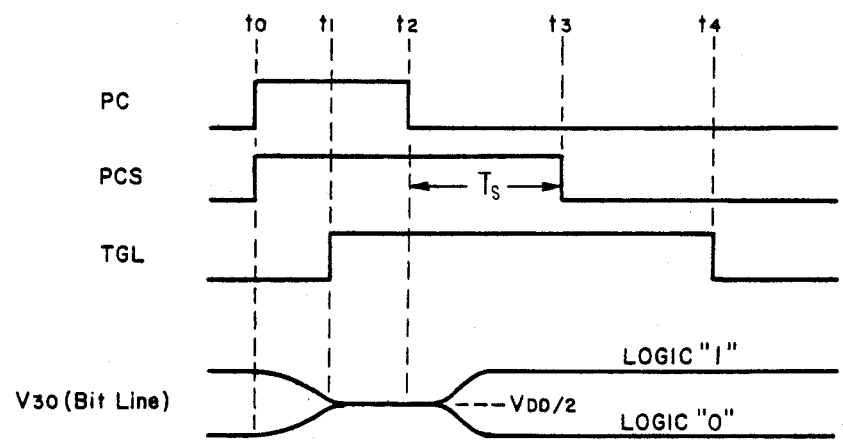

In the accompanying drawing like reference characters denote like components, and:

FIG. 1 is a partial schematic, partial block diagram, of a circuit embodying the invention; and FIG. 2 is a diagram of waveforms associated with the circuit of FIG. 1.

In FIG. 1, enhancement type insulated-gate field-effect transistors (IGFETs) of P conductivity type are identified by the letter P followed by a particular reference numeral; and enhancement type IGFETs of N-conductivity type are identified by the letter N followed by a particular reference numeral. The use of IGFETs is not intended to preclude the use of other suitable devices and to this end, the term "transistor", when used without limitation in the appended claims, is used in a generic sense.

The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive or less negative (higher) potential applied thereto. For an N-type IGFET the source electrode is defined as that one of the first and second electrodes having the less positive or more negative (lower) potential applied thereto.

2. Conduction occurs when the applied gate-to-source potential ) is in a direction to turn on the potential ($V_{GS}$) is in a direction to turn on the transistor and is greater in magnitude than a given value, which is defined as the threshold voltage ($V_T$) of the transistor.

To turn on a P type transistor its gate voltage ($V_G$) has to be more negative than its source voltage ($V_S$) by at least $V_T$. To turn on an N-type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near, ground is arbitrarily defined as a logic "0" or "low" condition and any potential at or near $+V_{DD}$ volts is arbitrarily defined as logic "1" or "high" condition.

The sense amplifier of FIG. 1 includes an inverter I10 comprised of IGFETs P10 and N10 of complementary conductivity type. The gate electrodes of P10 and N10 are connected to the inverter signal input terminal 30, their drain electrodes are connected to the inverter signal output terminal 32 and their source electrodes are connected to the inverter power terminals, $+V_{DD}$ and ground, respectively. The transition point, $V_P$, of inverter I10 is defined as the voltage level, which when applied to the gates of P10 and N10 causes them to conduct currents of equal amplitude in their source-to-drain paths and causes the potential (V32) at node 32 to be equal to $V_{DD}/2$. When the potential (V30) at node 30 is more positive than $V_P$ more current flows through N10 than is supplied from P10 and V32 decreases below $V_{DD}/2$. When V30 is less positive than $V_P$ more current is supplied by P10 than is sunk by N10 and V32 increases above $V_{DD}/2$. When a feedback connection is completed between the output (drains of P10 and N10) and input (gates of P10 and N10) of I10, in the absence of any signals or current other than the drain currents of P10 and N10, inverter I10 self-biases itself to adjust the potential at the gates of P10 and N10 to $V_P$. For ease of description, it is assumed in the discussion to follow that the source-to-drain impedances $Z_{P10}$ and $Z_{N10}$ of P10 and N10, respectively, are equal for like values of gate-to-source voltage ($V_{GS}$), making $V_P$ equal to $+V_{DD}/2$.

Transistors PG1 and NG1, which form a complementary transistor transmission gate TG1, have their conduction paths connected in parallel between the input 30 and output 32 of I10. When PG1 and NG1 are enabled, they complete a relatively low impedance feedback connection between output 32 and input 30 of I10 and bias I10 in its linear region where it has its highest gain. The turn-on and turn-off of TG1 is controlled by means of inverters I16 and I18. Inverter I16 is connected at its input to terminal 36 and at its output to terminal 38. I18 is connected at its input to terminal 38, to which the gate of PG1 also connects, and at its output to the gate of NG1. A normally "low" precharge signal (PC) is applied to terminal 36 whereby the voltage at terminal 38 is normally "high" (i.e., $V_{DD}$ volts) resulting in the application of "high" and "low" voltages to the gates of PG1 and NG1, respectively, which causes them to be turned-off and to present very high impedances between their respective source and drain electrodes. During a selected interval, (i.e., between times $t_0$ and $t_2$ shown in FIG. 2) a "high" precharge (PC) signal is applied to terminal 36, making terminal 38 and the gate of PG1 "low" and the gate of NG1 "high". This turns-on PG1 and NG1 and establishes an equivalent low impedance $Z_{TG1}$ between nodes 32 and 30 of I10.

A pulse stretching network 42 controls the turn-on and turn-off of a selectively enabled bias network 44 connected to node 30. Network 42 connected between terminals 36 and 40 is comprised of two cascaded skewed inverters I1 and I2. I1 is skewed to provide a significantly slower response to a negative going signal than to a positive going signal and I2 is skewed in the opposite sense. The net effect of their combined response is to provide a fast response to PC going positive and a relatively slow response to PC going negative. Consequently, as shown in FIG. 2, when PC applied to node 36 goes from low to high, at time $t_0$, the pulse (PCS) at node 40 follows almost immediately. However, when PC goes from high to low at time $t_2$, the response of PCS from high to low is delayed for a time $T_s$ until some later time $t_3$.

Bias network 44 includes a complementary inverter I3 connected at its input (gates of P3 and N3) to node 40 and at its output (drains of P3 and N3) to the drain and gate electrodes of P4 and to the gate electrode of P5. The source electrodes of P4 and P5 are connected to a point of $V_{DD}$ volts and the drain of P5 is connected to node 30. P4 and P5 function as a current mirror in that N3, when on, determines the amplitude of the source-to-drain current (IDS4) through P4. The amplitude of IDS4 causes a given potential VGS4 to be developed between the gate and source of P4 which is applied across P5. A current $I_B$ then flows through the source-to-drain path of P5 which is a function of its $V_{GS}$.

The amplitude and polarity of $I_B$ is selected such that a balanced output is produced by the sense amplifier. A balanced output means that the time to produce a valid output at node 32 corresponding to a logic "zero" signal from memory cell 9 should be approximately equal to the time it takes to produce a valid output at node 32 corresponding to logic "one" signal from memory cell 9.

When a logic "zero" signal is stored in the memory cell and the gate TGL is turned-on, a current $I_L"0"$ is drawn out of node 30 and via gating transistor NG and transistor NC1 to ground. When a logic "one" signal is stored in the memory cell and gate TGL is turned-on, a current $I_L"1"$ flows from $V_{DD}$ via transistors PC1 and NG into node 30. $I_L"0"$ is, typically, much larger than $I_L"1"$. By way of example, assume that $I_L"0"$ is equal to 20 microamperes and $I_L"1"$ is equal to 5 microamperes.

To obtain a balanced output for the polarities and typical values of $I_L"0"$ and $I_L"1"$ assumed above the following condition should exist:

$$I_L"0" - I_B = I_L"1" + I_B \qquad \text{eq. 1}$$

The value of $I_B$ must then be:

$$I_B = [I_L"0" - I_L"1"]/2 \qquad \text{eq. 2}$$

Where $I_L"0"$ is equal to 20 microamperes and $I_L"1"$ is equal to 5 microamperes, the current mirror would be designed to produce an $I_B$ of 7.5 microamperes. In general, for the condition when $I_L"1"$ is much smaller than $I_L"0"$, $I_B$ would be set approximately equal to $I_L"0"/2$. Where $I_L"1"$ would be equal to $I_L"0"$, $I_B$ would be set equal to zero.

The sense amplifier also includes a selectively enabled half latch circuit comprised of transistors P6 and P7 whose conduction paths are connected in series between $V_{DD}$ and node 30. The gate of P6 is connected to node 40 whereby P6, which is normally ON, is turned-off when PCS is high during precharge and sensing. The gate of P7 is connected to the output of an inverter I14 whose input is connected to the output of inverter I12 whose input is connected to node 32. P7 is turned-on when the output of I10 is low. This occurs as described below whenever a "high" or "1" signal which corresponds to the "ill" defined signal level is read out of the memory cell. The half latch circuit enables the ill defined condition to latch the sense amplifier to ensure that, when PCS terminates, the ill defined information from the memory cell will be stored.

In the description of the operation to follow, assume that a positive-going precharge pulse PC is applied to terminal 36 at time $t_0$. When PC goes high, the feedback connection across inverter I10 is completed and, concurrently, a bias current $I_B$ is applied to node 30 of I10. As discussed below, when PC is high (regardless of whether PCS is high or low) the sense amplifier is in a precharge mode and when PCS is high and PC is low, the sense amplifier is in a signal sensing and amplifying mode.

When PC goes high, the output ($V_{16}$) of inverter I16 goes low and the output ($V_{18}$) of inverter I18 goes high. This turns-on PG1 and NG1 providing a relatively low impedance conduction path between nodes 30 and 32. For the assumed condition of $Z_{P10}$ being equal to $Z_{N10}$ for like values of $V_{GS}$, $V_{30}$ is then equal to $V_{32}$ with both being equal to $V_{DD}/2$. I10 is then self-biased with its input and output being at the transition point $V_P$ of the inverter. The output ($V_{32}$) of I10 is applied to the input of I12 whose output is applied to the inputs of inverters I14 and I20. For ease of description, assume that inverters I12, I14 and I20 are complementary inverters similar to I10 and that like I10, the source-to-drain impedance of their P devices is equal to the source-to-drain impedance of their N devices for like values of $V_{GS}$. Accordingly, during precharge from time $t_0$ to $t_2$, $V_{32}$ is at $V_{DD}/2$ and the outputs of I12 and I14 are also precharged at, or close to, $V_{DD}/2$. I10 and I12 thus function to precharge nodes 30, 32 and 34 to $V_{DD}/2$.

In addition to completing the feedback loop the PC pulse is applied to pulse stretching network 42 generating the PCS pulse at node 40 which is in phase with PC but which extends for a period of time $T_s$ after PC ends.

When PCS is high, transistor P6 is turned-off preventing conduction via P6 and P7 into node 30. Concurrently, PCS high applied to the input of inverter I3 turns-off P3, and turns-on N3. The turn-on of N3 causes current $I_{DS4}$ to flow from $V_{DD}$ through the source-drain paths of P4 and N3 to ground. The current through P4 generates a gate-to-source potential ($V_{GS4}$) across the gate-to-source of P4 which is applied across the gate-to-source of P5. P5 conducts whenever PCS is high and functions as a relatively constant current source, supplying a relatively fixed bias current ($I_B$) into node 30. The amplitude of $I_B$ varies as a function of the characteristics (threshold and impedance) of an N type transistor (i.e. N3) and of a P-type (i.e. P4) transistor. As detailed below, making $I_B$ a function of an N and a P transistor compensates for certain variations in the signal current produced by memory cell 9 which is also comprised of N and P transistors.

Where the sense amplifier is formed on the same IC as the memory cells (whose current it is designed to sense) the characteristics of the transistors in the sense amplifier will track those of the memory cells. In particular, making $I_B$ a function of the linear response of transistors of P and N conductivity provides a high degree of compensation for variations in the signals to be sensed, since those signals are produced by N and/or P transistors.

At some point $t_1$, after $t_0$ and before $t_2$, a transmission gate TGL is turned-on coupling the output of selected memory cell 9 to node 30. Cell 9 is selected by means of transmission gate NG being turned-on by a positive (e.g. $V_{DD}$) signal applied to the word line during a time interval $t_1$ to $t_4$.

If the memory cell is storing a logic "zero", NC1 is turned-on, and PC1 is turned-off. A relatively large current referred to herein as the logic "zero" current, or $I_L$"0" can then flow out of node 30 to ground via the series conduction paths of NG and NC1 which conduct in the common source mode. If the memory cell is storing a logic "one", PC1 is ON and NC1 is OFF. NG is turned-on, but conducts in the source follower mode and only a relatively small current referred to herein as the logic "one" current or $I_L$"1" can flow from $V_{DD}$ via PC1 and NG into node 30.

During the precharge interval ($t_0$ to $t_2$) when PC is present (high) and TG1 is turned-on, there is little, if any, offset at the input of inverter I10. This is achieved by making $Z_{P10}$ and $Z_{N10}$ as well as $Z_{TG1}$ relatively low impedances compared to the effective equivalent impedances of P5 and the memory cell output. Although the effect of the bias ($I_B$) and signal currents ($I_L$"0" or $I_L$"1") is minimal during precharge these currents are applied to node 30 prior to time $t_2$ to enable these signals to stabilize and to reduce switching transients before precharge ends at time $t_2$.

At time $t_2$ PC goes low terminating the precharge period and beginning the signal sensing period. When PC goes low, TG1 is turned-off and inverter I10, which was biased at its transition point, now functions as a high gain amplifier of great sensitivity. Since the input of I10 is precharged at, or close to, its transition point, its output $V_{32}$ is close to $V_{DD}/2$ at the termination of precharge. Consequently, at time $t_2$, there is no abrupt change at the output of I10. Hence there is no need to either take time to restore the output or for circuitry to minimize the offset. At time $t_2$, either $I_B$ plus $I_L$"1" flow into node 30 or $I_L$"0" minus $I_B$ flow out of node 30. Node 30 can then be charged up towards $V_{DD}$ or discharged towards ground as a function of the net current into or out of the nodal capacitance. Because of the high gain of I10, I12 and I20, which are precharged to this midpoint, a small change at node 30 results in the quick charging or discharging of the master bit line (MBL).

If a logic zero is stored in the memory cell, $I_L$"0" which is significantly greater than $I_B$ and of opposite polarity, causes a net current to be drawn out of node 30. Consequently, node 30 quickly goes below $V_{DD}/2$, as shown in FIG. 2, and the output of inverter I10 is quickly driven towards $V_{DD}$, which signal is then amplified by inverter I12, producing a "low" signal at its output. The low at the output of I12 is inverted by I14, maintaining transistor P7 turned-off. Concurrently, the signal inverted by I20 is applied to the master bit line (MBL).

If a logic "1" is stored in the memory cell, $I_L$"1" and $I_B$ which are of similar polarity flow into node 30 raising node 30 above $V_{DD}/2$, as shown in FIG. 2. Consequently, $V_{32}$ goes low and $V_{34}$ goes high. V34 high is inverted by I14 turning-on P7. When PCS terminates at time $t_3$, P6 and P7 are turned-on and conduct and the high level at node 30 is latched in the sense amplifier. This ensures the reliable sensing of the "ill" defined condition. The use of a linear current mirror provides a high degree of compensation for variations in the signal source current as discussed below. Assume, for example, that $I_L"0"$, $I_L"1"$ and $I_B$ are designed to normally equal 20 microamperes, 5 microamperes and 7.5 microamperes, respectively, whereby normally $I_{L0} - I_B = I_{L1} + I_B$.

Assume, now, that the threshold voltage ($V_{TN}$) of the N devices of the memory array decrease causing the $I_L"0"$ current to increase. For example, assume that $I_L"0"$ increases from 20 microamperes to 30 microamperes. Where all the transistors in the circuit of FIG. 1 are formed on the same integrated circuit, the $V_{TN}$ of transistor N3 decreases in the same manner as that of NC1, NC2 and NG. Consequently, $I_B$ increases due to a decrease in the $V_{TN}$ of N3, since a decrease in the $V_{TN}$ of N3 causes an increase in the current through N3 and through P4. This increased current causes an increase in the $V_{GS}$ developed across P4 and P5 causin $I_B$ to increase. The increase in $I_B$ need not be as extensive as the increase in $I_L"0"$ since $I_L"0"$ is dependent on the $V_{TN}$ of NG and NC1 conducting in series whereas $I_B$ only depends on the $V_{TN}$ of N3. Thus, whereas $I_L"0"$ increased from 20 to 30 microamperes, $I_B$ might increase from 7.5 to 12.5 microamperes. This result provides very effective compensation since a variation in $I_B$ of one half the difference between $I_L"0"$ and $I_L"1"$ maintains a balanced output. For the example where $I_L"1"$ is a relatively small current compared to $I_L"0"$ effective compensation is achieved when $I_B$ varies at approximately one half the rate of $I_L"0"$.

For the example above, excellent compensation is obtained since the variation in $I_L"0"$ and $I_B$ is such that Eq. 1 and Eq. 2 are satisfied and a balanced condition is maintained. Thus the current mirror comprised of complementary devices similar to those in the memory compensates for changes in $V_{TN}$.

The circuit also provides compensation when $V_{TN}$ increases and $I_L"0"$ decreases since an increase in $V_{TN}$ causes a decrease in $I_L"0"$ and $I_B$ whereby a degree of compensation is achieved.

The current mirror of FIG. 1 provides a significant advantage over prior art circuits in which an offset or bias current is provided by grounding the gate electrode of a transistor such as P5. The offset or bias current provided by a grounded gate transistor cannot compensate for variation in $V_{TN}$. For such a circuit, if $V_{TN}$ were to vary the signal source currents would vary while the bias currents would not necessarily provide any compensation. Hence, the amplifier output would no longer be balanced.

The complementary transistor current mirror also provides compensation when the threshold voltage ($V_{TP}$) of the P devices in the memory cell vary. Assume, for example, that $V_{TP}$ increases causing a decrease in $I_L"1"$ from 5 to 2 microamperes. In the circuit of FIG. 1, a change in $V_{TP}$ does not result in a significant change in $I_B$ since it is the current through N3 which dominates the setting of $I_B$. This is in sharp contrast to the case where the gate of P5 would be returned to ground. In that case $I_B$ would decrease in like manner to $I_L"1"$ resulting in an increase in the imbalance during sensing. Thus, the current mirror also tends to reduce the imbalance resulting from a change in $V_{TP}$.

It should be appreciated that the sense amplifier is a dual clock sense amplifier in that the positive portion of the PC pulse defines one clock cycle and the positive portion of PCS after PC goes low defines the second clock cycle.

In FIG. 1, the second clock cycle is generated by network 42 comprised of two cascaded inverters. However, network 42 could be replaced by any suitable monostable multivibrator or like timing circuit.

What is claimed is:

1. The combination comprising:
    a current summing node;
    first and second power terminals for the application therebetween of an operating potential;
    a signal source comprising a gating transistor of first conductivity type, whose conduction path is connected between a first node at which binary signals are produced and an output node, said gating transistor conducting either in the common source mode and passing a first relatively large current I1 of one polarity for one value of binary signal at said first node or in the source follower mode and passing a second relatively small current I2 of opposite polarity for the other value of binary signal at said first node;
    means for selectively coupling said output node to said summing node; and
    a selectively enabled biasing means including a current mirror coupled to said summing node for applying, when said biasing means is enabled, a bias current to said summing node of amplitude intermediate I1 and I2 and of the same polarity as I2, said current mirror including a first current setting transistor of like conductivity to said gating transistor.

2. The combination as claimed in claim 1 wherein said current mirror includes, in addition to said first current setting transistor:
    (a) second and third transistors of complementary conductivity type to that of said gating and first current setting transistors; each transistor having a conduction path and a control electrode;
    (b) means connecting one end of the conduction path of said first transistor to one of said first and second power terminals;
    (c) means connecting one end of the conduction paths of said second and third transistors to the other one of said first and second power terminals;
    (d) means connecting the other end of the conduction path of said third transistor to said summing node;
    (e) means connecting the other ends of the conduction paths of said first and second transistors together and to the control electrodes of said second and third transistors; and
    (f) means for selectively applying a turn-on signal to the control electrode of said first transistor.

3. The combination as claimed in claim 2 wherein said transistors are insulated-gate field-effect transistors (IGFETs).

4. The combination as claimed in claim 3 wherein said signal source includes a bistable element comprised of two cross coupled inverters, each inverter formed by interconnecting transistors of complementary conductivity type, each inverter having an input and an output, and the output of one of said two inverters being connected to said first node.

5. A sense amplifier comprising:
    means for receiving recurrent precharge pulses;
    an inverter having a signal input terminal, a signal output terminal, and first and second power terminals for receiving an operating potential therebetween, said inverter exhibiting a voltage transition point having a value between a first voltage level representing a first logic condition and a second voltage level representing a second logic condition, said output signal terminal of said inverter being driven toward one of said first and second voltage levels depending on whether a particular voltage being applied to its signal input terminal is above or below said voltage transition point;

selectively enabled feedback means responsive to each precharge pulse for completing a feedback connection from the output signal terminal of said inverter to its input signal terminal and placing said inverter at, or close to, said transition point during each precharge pulse occurence;

means including a selectively enabled gating transistor for selectively coupling signals to be sensed to the input signal terminal of said inverter, at selected times, each of which times follows the inception of a precharge pulse and lasts for a period of time $T_s$ following the termination of each precharge pulse, the applied signals to be sensed having either one binary value characterized by a relatively large current $I_1$ of one polarity or the other binary value characterized by a relatively small current $I_2$ of opposite polarity to said one polarity; and selectively enabled bias means responsive to each precharge pulse, said bias means being enabled after the inception of each precharge pulse for a period $T_s$ following the termination of each precharge pulse, said bias means including a current mirror for applying a bias current to the input of said inverter having a value intermediate said $I_1$ and $I_2$ and of same polarity as $I_2$, and the amplitude of said bias current being set by a transistor of like conductivity type to said gating transistor for causing said bias current to vary in a similar manner as $I_1$ and $I_2$.

6. The sense amplifier as set forth in claim 5 wherein said current mirror includes:

a first IGFET of first conductivity type;

second and third insulated-gate field-effect transistors (IGFETs) of second conductivity type;

means connecting the drain electrode of said third IGFET to the input of said inverter;

means connecting the source electrodes of said second and third IGFETs to one of said first and second power terminals;

means connecting the gate electrodes of said second and third IGFETs to the drains of said first and second IGFETs;

means connecting the source electrode of said first IGFET to the other one of said first and second power terminals; and means responsive to the occurrence of precharge pulse for applying a turn-on signal to the gate electrode of said first IGFET.

7. The combination as claimed in claim 6 wherein said means which includes means for selectively coupling the signals to be sensed further includes a memory cell and wherein said gating transistor has a conduction path connected between a binary storage node and an output node which is selectively coupled to said inverter input signal terminal.

8. In combination with a memory cell having an input-output (I/O) point and a gating transistor whose conduction path is connected between said I/O point and a bit line and said gating transistor conducting either a first relatively large current $I_1$ of one polarity for one value of binary signal at said I/O point or a second relatively small current $I_2$ of opposite polarity for the other value of binary signal at said I/O point, a sense amplifier comprising:

amplifying means having a signal input, a signal output, first and second terminals for the application therebetween of an operating potential, and exhibiting a transition point between first and second logic conditions at its output responsive to a particular voltage being applied to its input;

means selectively coupling the input of said amplifying means to said bit line;

selectively enabled feedback means for completing, when enabled, a feedback connection between said output and said input of said amplifying means and for then placing said signal input and said signal output at the transition point of said amplifying means;

a selectively enabled biasing means including a current mirror comprised of components similar to those forming said memory cell for generating a bias current ($I_B$) having an amplitude intermediate $I_1$ and $I_2$ and of the same polarity as $I_2$ and which varies in a direction to compensate for variations in $I_1$ and $I_2$, and for applying, when enabled, said bias current ($I_B$) to said input of said amplifying means;

means for, during a first time interval, enabling said feedback means for precharging the input and output of said amplifying means to the transition point of said amplifying means and for, during a second succeeding time interval, disabling said feedback means and then operating said amplifying means in a high gain mode; and means for, during said second succeeding time interval, concurrently applying said bias current and the memory cell signal via said gating transistor to the input of said amplifying means.

9. In combination with a memory cell comprised of first and second complementary inverters comprising IGFETs, with the output of said first inverter being connected to an input-output (I/O) point and said cell including a gating transistor whose conduction path is connected between said I/O point and a bit line and said gating transistor conducting either in the common source mode and passing a first relatively large current $I_1$ of one polarity for one value of binary signal at said I/O point or in the source follower mode and passing a second relatively small current $I_1$ of opposite polarity for the other value of binary signal at said I/O point, a sense amplifier comprising:

inverting means having a signal input and a signal output and first and second terminals for the application therebetween of an operating potential;

means for selectively coupling the input of said inverting means to said bit line;

selectively enabled feedback means for completing, when enabled, a feedback connection between said signal output and said signal input of said inverting means; and a selectively enabled biasing means including a current mirror for applying, when enabled, a bias current ($I_B$) to said input of said inverting means of amplitude intermediate $I_1$ and $I_2$ and of the same polarity as $I_2$; said current mirror comprising IGFETs of like conductivity to those in the memory cell and said current mirror including a current setting transistor of like conductivity type to said gating transistor for causing $I_B$ to change in a direction to compensate for changes in $I_1$ and $I_2$ as a function of changes in the characteristics of the memory cell transistors.

10. The combination comprising:

a current summing node;

first and second power terminals for the application therebetween of an operating potential;

a signal source comprising a gating transistor of first conductivity type, whose conduction path is connected between a first node at which binary signals are produced and an output node, said gating transistor conducting either in the common source mode and passing a first current I1 of one polarity for one value of binary signal at said first node or in the source follower mode and passing a current I2 of opposite polarity for the other value of binary signal at said first node;

means for selectively coupling said output node to said summing node;

a selectively enabled biasing means including a current mirror for applying, when enabled, a bias current to said summing node having an amplitude intermediate that of I1 and I2 and the same polarity as I2, said current mirror comprising:

(a) a first transistor of said first conductivity type and second and third transistors of second conductivity type; each transistor having a conduction path and a control electrode;

(b) means connecting one end of the conduction path of said first transistor to one of said first and second power terminals;

(c) means connecting one end of the conduction paths of said second and third transistors to the other one of said first and second power terminals;

(d) means connecting the other end of the conduction path of said third transistor to said summing node;

(e) means connecting the other ends of the conduction paths of said first and second transistors together and to the control electrodes of said second and third transistors; and (f) means for selectively applying a turn-on signal to the control electrode of said first transistor.

11. The combination as claimed in claim 10 wherein said transistors are insulated-gate field-effect transistors (IGFETs).

12. The combination as claimed in claim 11 wherein said signal source includes a bistable element comprised of two cross coupled inverters, each inverter formed by interconnecting transistors of complementary conductivity type, each inverter having an input and an output, and the output of one of said two inverters being connected to said first node.

* * * * *

UNITED STATES PATENT AND TRADEMARK OFFICE
CERTIFICATE OF CORRECTION

PATENT NO. : 4,567,387

DATED : Jan. 28, 1986

INVENTOR(S) : Ihor T. Wacyk

It is certified that error appears in the above-identified patent and that said Letters Patent is hereby corrected as shown below:

Col. 2, line 65, remove "potential) is in a direction to turn on the"

Col. 4, line 54, change "$I_{L"1"0}$" to - - - $I_{L"1"}$ - - -.

Col. 6, line 60, change "$I_{I"1"}$" to - - - $I_{L"1"}$ - - -.

Col. 7, line 18, change "causin" to - - - causing - - -.

Signed and Sealed this

Thirteenth Day of May 1986

[SEAL]

Attest:

DONALD J. QUIGG

Attesting Officer

Commissioner of Patents and Trademarks